United States Patent [19]

Yoneda

[11] Patent Number: 5,175,118
[45] Date of Patent: Dec. 29, 1992

[54] MULTIPLE LAYER ELECTRODE STRUCTURE FOR SEMICONDUCTOR DEVICE AND METHOD OF MANUFACTURING THEREOF

[75] Inventor: Masahiro Yoneda, Hyogo, Japan

[73] Assignee: Mitsubishi Denki Kabushiki Kaisha, Tokyo, Japan

[21] Appl. No.: 787,862

[22] Filed: Nov. 5, 1991

Related U.S. Application Data

[62] Division of Ser. No. 405,283, Sep. 11, 1989, Pat. No. 5,079,617.

[30] Foreign Application Priority Data

Sep. 20. 1988 [JP] Japan ................. 63-236043

[51] Int. Cl.⁵ .................................. H01L 21/70
[52] U.S. Cl. .................................. 437/40; 437/41; 437/44; 437/162; 437/192; 437/200; 437/228; 437/233
[58] Field of Search ............. 437/40, 41, 44, 162, 437/192, 200, 228, 233, 235

[56] References Cited

U.S. PATENT DOCUMENTS

| | | | |
|---|---|---|---|
| 4,324,038 | 4/1982 | Chang et al. | 437/162 |
| 4,329,706 | 5/1982 | Crowder et al. | 357/71 |
| 4,392,150 | 7/1983 | Courreges | 357/51 |
| 4,398,335 | 8/1983 | Lehrer | 357/71 |
| 4,419,810 | 12/1983 | Riseman et al. | 437/162 |
| 4,764,481 | 8/1988 | Alui et al. | 437/162 |
| 4,855,798 | 8/1989 | Imamura et al. | 357/71 |
| 4,901,134 | 2/1990 | Misawa et al. | 357/69 |

FOREIGN PATENT DOCUMENTS

0183995A1  6/1986  European Pat. Off.
0033825    2/1984  Japan.
61-16573   1/1986  Japan.

OTHER PUBLICATIONS

Neues aus der Technik, No. 4 vom 15, Aug. 15, 1983 (German).
IBM Technical Disclosure Bulletin, vol. 28, No. 1, Jun. 1985, pp. 26-27.
Huang et al., "A MOS Transistor with Self-Aligned Polysilicon Source-Drain", IEEE Electron Device Letters, vol. EDL-7, No. 5, May 1986, pp. 314-316.

*Primary Examiner*—Tom Thomas
*Attorney, Agent, or Firm*—Lowe, Price, LeBlanc & Becker

[57] ABSTRACT

A MOS FET comprises a gate electrode and source and drain regions. Conductive layers for electrode are formed on surfaces of the source and drain regions. The conductive layers for electrode are formed by a multilayer structure including a high melting point metal silicide film in contact with the source and drain regions and a polycrystaline silicon layer formed thereon. The gate electrode is formed of polysilicon. The gate electrode has a structure in which part of the gate electrode extends over the conductive layers for electrode formed on the source and drain regions. Such structure reduces the resistance of the interconnection layers for electrodes and realizes reduction in width of the gate electrode. In the manufacturing method, the patterning of the conductive layers for electrodes on the surface of the source/drain regions comprises the steps of etching the polycrystalline silicon layer by dry etching, and etching the high melting point metal silicide layer by wet etching. The wet etching enables etching process without damaging the silicon substrate surface.

8 Claims, 4 Drawing Sheets

MULTIPLE LAYER ELECTRODE STRUCTURE FOR SEMICONDUCTOR DEVICE AND METHOD OF MANUFACTURING THEREOF

This application is a division of application Ser. No. 07/405,283, filed Sep. 11, 1989, now U.S. Pat. No. 5,079,617.

BACKGROUND OF THE INVENTION

1. Field of the Invention

The present invention relates generally to semiconductor devices and more particularly to electrode structures therefor. The present invention further relates to methods of manufacturing such structures.

2. Description of the Background Art

Recently, semiconductor devices have been developed with a view to increasing integration density and processing speeds according to demands for further advanced techniques. The purposes of increasing integration scales and processing speeds are in a certain aspect contradictory. It may happen that a high degree of integration scale of semiconductor devices prevents increase of a processing speed to the contrary. Therefore, techniques which can accomplish both of those purposes will be very useful.

The tendency to enhance integration density of semiconductor devices necessarily leads to microscopic sizes of semiconductor devices or microscopic structures of individual semiconductor elements of each semiconductor device. For example, Japanese Patent Laying-Open No. 16573/1986 discloses a finely reduced structure of a MOS (metal oxide semiconductor) device. FIG. 3 shows a sectional structure of a MOS FET (field effect transistor) indicated in this prior art. The MOS FET 1 shown in FIG. 3 comprises a gate electrode 4 formed of a polycrystalline silicon layer through a thin gate oxide film 3 on a surface of a silicon substrate 2. A source region 5 and a drain region 6 formed by diffusion of impurity are spaced from each other on the surface of the silicon substrate 2. A surface region of the silicon substrate 2 located between the source region 5 and the drain region 6 is a channel region of the MOS FET 1. Conductive layer portions 7 and 8 of polycrystalline silicon for electrodes are formed on the source region 5 and the drain region 6, respectively. The respective conductive layer portions 7 and 8 extend over upper surfaces of each field oxide film 9 for device isolation from the surfaces of the source region 5 and the drain region 6, respectively. The conductive layer portions 7 and 8 for electrodes on the field oxide film 9 are connected with aluminum connection layer 11 through contact holes provided in an interlayer insulating film 10.

This prior art has the below described features from a viewpoint of the fine structure.

(1) The gate electrode 4 is formed with a gate electrode width in a lower portion thereof being different from that in an upper portion. The gate electrode width in the lower portion of the electrode 4 is shorter and accordingly a channel length of the MOS FET defined by this width can be shortened. The gate electrode width in the upper portion of the electrode 4 is wider, which serves to prevent reduction of a sectional area of the gate electrode 4. As a result of preventing the reduction of the sectional area of the gate electrode 4, it is made possible to prevent increase of a connection resistance between the gate electrode 4 and external structures such as word lines.

(2) The source region 5 and the drain region 6 have contacts with the respective aluminum connection layer regions 11 on the field oxide film 9 through the conductive layer portions 7 and 8. Consequently, it is not necessary to provide space for direct contacts between the source and the drain regions 5 and 6 and the aluminum connection layer 11. Thus, the impurity diffusion areas of the source and drain regions 5 and 6 can be reduced.

Next, main steps of manufacturing of this prior art MOS FET will be described with reference to FIGS. 4A to 4C.

First, a polycrystalline silicon layer 12 and a silicon oxide film 13 are deposited on the surface of the silicon substrate 2 provided with a field oxide film 9 (as shown in FIG. 4A).

Then, using a photolithographic process and an etching process, the silicon oxide film 13 and the polycrystalline silicon layer 12 deposited on the surface of the silicon substrate 2 are etched and removed so that a channel region of the MOS FET is provided. This etching used is plasma dry etching. As a result, a surface of the channel region is exposed on the silicon substrate 2 (as shown in FIG. 4B). Plasma etching is a method of generating and removing a volatile material through a reaction between excited atoms and molecules in the ion impacted gas plasma and the polycrystalline silicon layer 12. After the polycrystalline silicon layer 12 is removed, the surface of the silicon substrate 2 is subjected to the impact of the ions in the plasma. By the ion impact, the surface of the silicon substrate 2 is made rough an damaged.

Further, a thermal oxidation process is applied to form a gate oxide film 3 on the channel region surface of the silicon substrate 2 and inner side walls of the opening of the polycrystalline silicon layer 12. After that, a heating process is applied in an atmosphere of nitrogen to diffuse the impurity contained in the polycrystalline silicon layer 12 into the silicon substrate 2, whereby a source region 5 and a drain region 6 are formed (as shown in FIG. 4C).

However, as a result of a finely reduced structure of the elements, the MOS FET having the above described structure and manufactured in the above described steps involves disadvantages as described below.

(a) Although it is necessary to decrease the junction depth of the source and the drain regions according to the scaling rule by the reduction of the structure of the devices, it becomes difficult to control formation of those regions by thermal diffusion from the polycrystalline silicon layer 12 as the junction depth decreases.

(b) The contact method in which the source and drain regions 5 and 6 in the silicon substrate 2 are in direct contact with the conductive layer portions 7 and 8 for electrodes involves formation of a natural oxide film at the respective interfaces therebetween, which causes increase in a contact resistance and obstruction to a good ohmic contact.

(c) As shown in FIG. 4B, the step of etching and removing the silicon oxide film 13 and the polycrystalline silicon layer 12 is executed by using plasma dry etching. Consequently, as described above, the surface of the silicon substrate 2 exposed at the end of etching is damaged by plasma. Such damage deteriorates characteristics of the transistor particularly because this surface region of the silicon substrate 2 functions as the channel region of the MOS FET.

Meanwhile, there is another problem caused by the miniaturization of the device structure of the transistors, namely, the problem of fluctuation of the characteristics of the transistors caused by the generation of hot carriers. When the channel length of the transistor becomes shorter, the electric field is concentrated near the drain, generating hot carriers. Part of the hot carriers enter the gate oxide film and trapped therein. The trapped carriers cause fluctuation of the threshold voltage and the degradation of the mutual conductance. A so-called LDD (lightly doped drain) structure has been known as the structure for preventing fluctuation of the characteristics of the MOS FETs caused by the hot carriers. In the LDD structure, an impurity region having the same conductivity type as the drain region but lower concentration is provided between the channel region and the drain region. The impurity region of the low concentration releases the concentration of the electric field near itself, thereby reducing generation of the hot carriers.

As described above, the LDD MOS FET is effective in suppressing fluctuation of characteristics of the transistor caused by the generation of hot carriers, and accordingly, the improvement of the interconnection structure described above as well as the improvement of the LDD MOS FET are very important in the technique of miniaturization.

SUMMARY OF THE INVENTION

An object of the present invention is to provide a semiconductor device having a microscopic size in which lowering of resistance of conductive layers for electrodes is accomplished.

Another object of the present invention is to provide an improvement in control of formation of impurity diffusion regions in a semiconductor substrate of a semiconductor device.

A further object of the present invention is to form impurity regions of shallow junction depth in a semiconductor substrate of a semiconductor device.

A further object of the present invention is to provide compensation for low resistance of shallow impurity regions formed in the substrate of the semiconductor device.

A further object of the present invention is to increase the breakdown voltage of semiconductor device.

A further object of the present invention is to provide a method of manufacturing a semiconductor device which makes it possible to prevent damage on a surface of a semiconductor substrate due to etching in a patterning process of conductive layers for electrodes.

A further object of the present invention is to provide a method of manufacturing LDD regions on the substrate of the semiconductor device.

The MOS type semiconductor device in accordance with the present invention comprises conductive layers for electrodes on the surfaces of a pair of impurity regions. The conductive layers for electrode are formed by, for example, a laminated structure of a layer containing a high melting point metal having high conductivity and a polycrystalline silicon layer and, thus, a connection resistance can be lowered compared with a conventional single-layer structure of polycrystalline silicon.

In addition, contact between the impurity diffusion regions and the conductive layers for electrode is made through the high melting point metal film and the like. Accordingly, a contact resistance is lowered compared with a conventional type in which the impurity diffusion regions and the polycrystalline silicon conductive layer are in direct contact. Further, a sheet resistance in the impurity diffusion regions is lowered compared with the prior art.

In addition, the impurity diffusion regions are formed by thermally diffusing, into the semiconductor substrate, through the high melting point metal film, the impurity contained in the polycrystalline silicon layer of each conductive layer for the electrode. In this step, the high melting point metal film serves to increase a diffusion distance from the polycrystalline silicon layer as the impurity source to a region where an impurity region is to be formed in the semiconductor substrate. A diffusion rate of the impurity in the high melting point metal film is lower than that in the silicon layer. Consequently, it is easy to regulate a period of the thermal diffusion process by setting a long period for diffusion of the impurity in the semiconductor substrate. Thus, control efficiency for the thermal diffusion process can be enhanced and junctions of a shallow depth can be formed easily.

According to another example of the present invention, the conductive layer for electrode of the semiconductor device is formed by forming a layer of a metal having high melting point and a polycrystalline silicon layer on the surface of the semiconductor substrate and thereafter by patterning these layers to the prescribed shape through two etching processes. The high melting point metal film is used as a protection film against etching when the polycrystalline silicon film on the high melting point metal film is to be etched. This is because in a conventional etching process of the polycrystalline silicon film, the surface of the semiconductor substrate is damaged by the etching. Therefore, the high melting point metal film is placed on the semiconductor substrate and this film serves to prevent the surface of the semiconductor substrate from being directly exposed by the etching of the polycrystalline silicon film and to protect the surface from being damaged by the etching. After the etching process of the polycrystalline silicon film, the metal film is removed by an etching process causing little damage to the surface of the semiconductor substrate, whereby damage on the surface of the semiconductor substrate can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention will be described in the following with reference to the drawings.

First, a preferred first embodiment of the present invention will be described with reference to FIGS. 1A to 1F showing a structure of a MOS FET according to steps of a manufacturing method thereof.

Figure 1A:
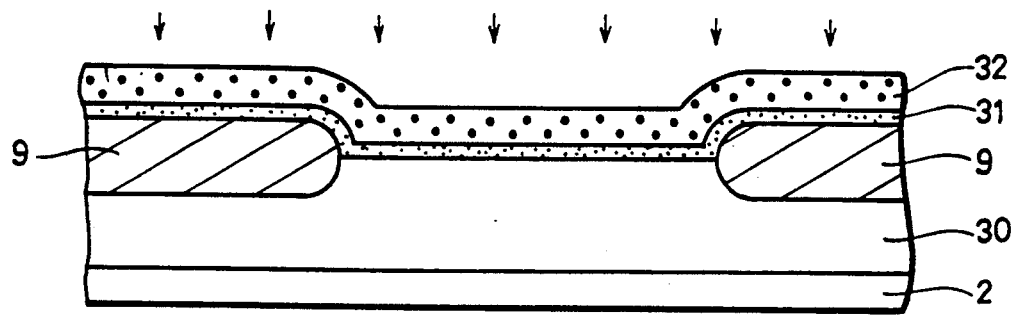
FIGS. 1A to 1F are sectional views showing successive steps of a method of manufacturing a MOS FET according to a first embodiment of the present invention.

First of all, a field oxide film 9 for device isolation is formed by a method of LOCOS (local oxidation of silicon) in predetermined regions on a surface of a silicon substrate 2 where a well region 30 is formed. Then, a high melting point metal silicide film 31 of tungsten silicide ($WSi_x$), titanium silicide ($TiSi_x$) or the like is formed on the surface of the silicon substrate 2. One method of forming the silicide layer comprises a step of depositing a metal having high melting point on the surface of the silicon substrate 2 by the CVD (chemical vapor deposition) method or by sputtering. Thereafter, thermal processing is carried out so as to turn that region of the metal having high melting point which is in contact with the surface of the silicon substrate into silicide. The thermal processing for silicifying that region may not be carried out. In that case, the silicide layer is incidentally formed through the thermal processing carried out in the subsequent steps. For example, the thickness of the layer of the metal having high melting point is about 1000 to 3000 Å and preferably, it is about 2000 Å. More specifically, the lower limit of the film thickness is selected to be sufficient for preventing roughening of the quality of the metal having high melting point. The upper limit of the film thickness is selected to be sufficient not to degrade patterning precision due to the increase of the etching amount in the direction of the film plane by the wet etching, as will be described later. Further, a first polycrystalline silicon film 32 is deposited thereon by using the CVD method. The thickness of the first polycrystalline silicon film 32 is about 2500 Å. Then, impurity such as arsenic is injected in the first polycrystalline silicon film 32 by an ion implantation method (as shown in FIG. 1A).

Figure 1B:
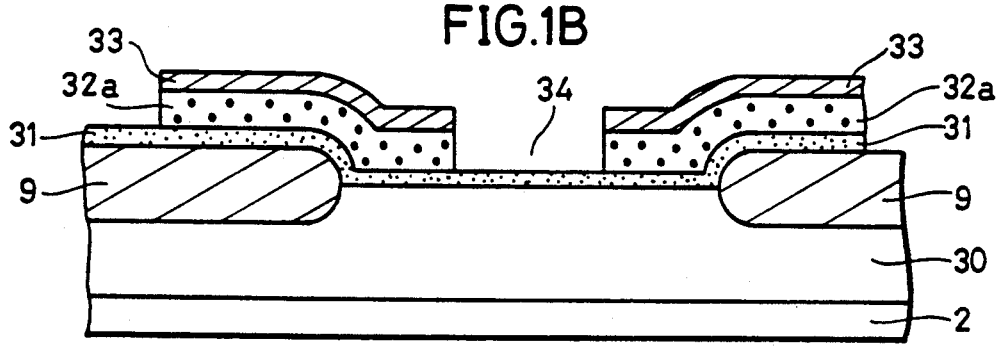
Figure 1C:
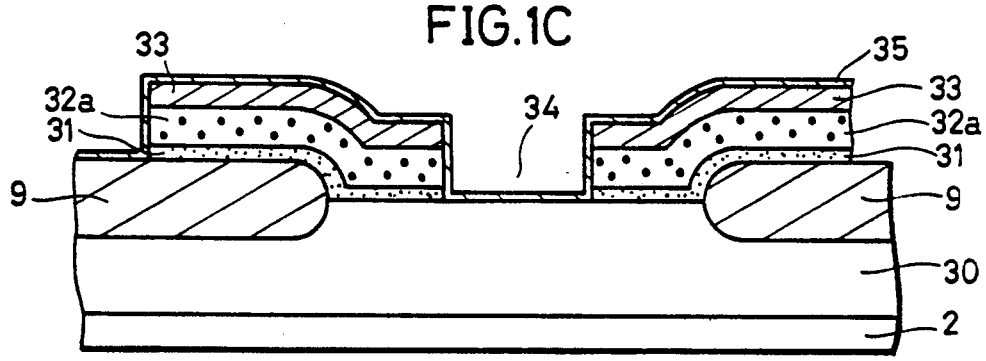

Then, an oxide silicon film 33 is deposited on the first polycrystalline silicon film 32 by the CVD method. Thereafter, portions of the first polycrystalline silicon film 32 and the oxide silicon film 33 deposited on a predetermined surface region of the silicon substrate 2 assigned for a channel region 34 of the MOS FET are removed by using a photolithographic process and a plasma etching process or the like. As a result, a predetermined region of the high melting point metal silicide film 31 is exposed. The first polycrystalline silicon film 32 patterned by this etching process functions as electrodes 32a for source and drain regions (as shown in FIG. 1B).

Then, the exposed region of the high melting point metal silicide film 31 is removed by using a wet etching process. The wet etching process is applied by using for example solution of hydrofluoric acid or solution of mixture of hydrofluoric acid and ammonium fluoride. The wet etching process is adopted particularly because this process does not damage the surface of the silicon substrate 2 to be the channel region 34.

After that, an insulating film 35 such as a silicon oxide film or a silicon nitride film is formed over the channel region 34 of the surface of the silicon substrate 2 and the upper and side surfaces of the patterned multiple films 31, 32a and 33 by using the CVD method. The insulating film 35 on the channel region 34 constitutes a gate insulating film of the transistor (see FIG. 1C).

Figure 1D:
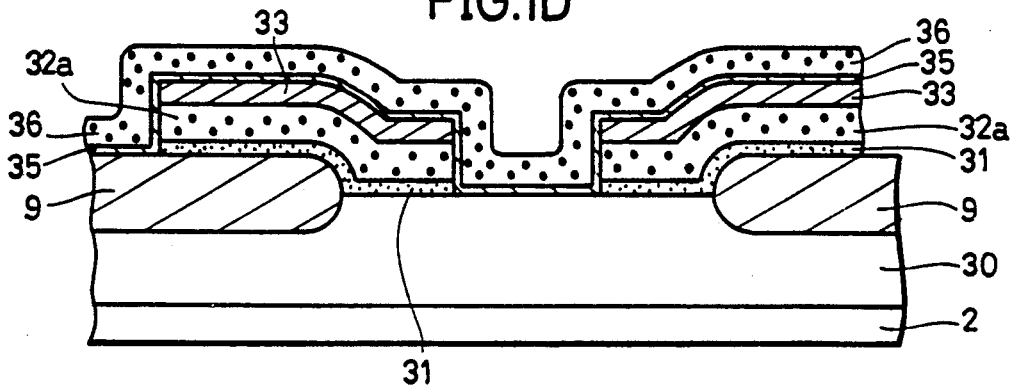

Then, a second polycrystalline silicon film 36 is deposited on the whole surface by using the CVD method (as shown in FIG. 1D).

Then, a heat treatment process for forming source and drain regions is applied. The impurity such as phosphorus or arsenic contained in the first polycrystalline silicon film 32a passes through the high melting point metal silicide film 31 and is diffused into the silicon substrate 2 by the heat treatment at high temperature. As a result, a source region 5 and a drain region 6 are formed in the silicon substrate 2. The high melting point metal silicide film 31 serves to increase a diffusion distance required for the impurity to attain the predetermined regions in the silicon substrate 2. Part of the impurity such as arsenic is captured in the high melting point metal silicide film 31. Thus, the period required for the thermal diffusion is lengthened and the control efficiency for the thermal diffusion process is improved. Therefore, the thermal diffusion process period can be controlled with high precision, making it possible to form the source and drain regions 5 and 6 having a shallow junction depth.

Figure 1E:
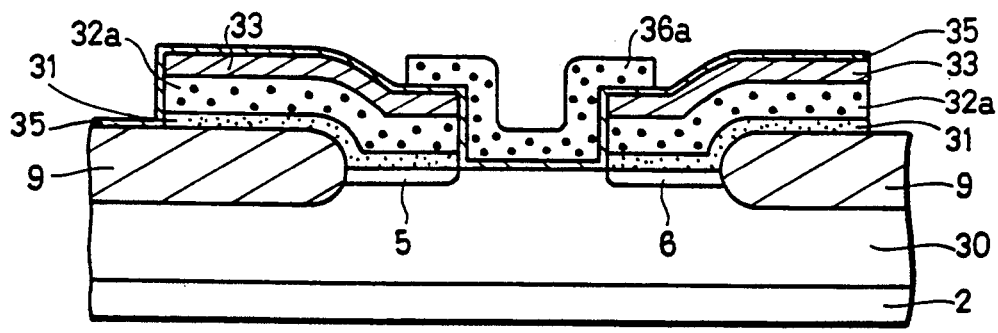

After that, the second polycrystalline silicon film 36 is etched by using a photolithographic process. As a result, a ate electrode 36a is patterned. The gate electrode 36a is formed to extend partially over surfaces of the first polycrystalline silicon film 32a which become electrodes drawn from the source and drain regions 5 and 6 (as shown in FIG. 1E).

Figure 1F:
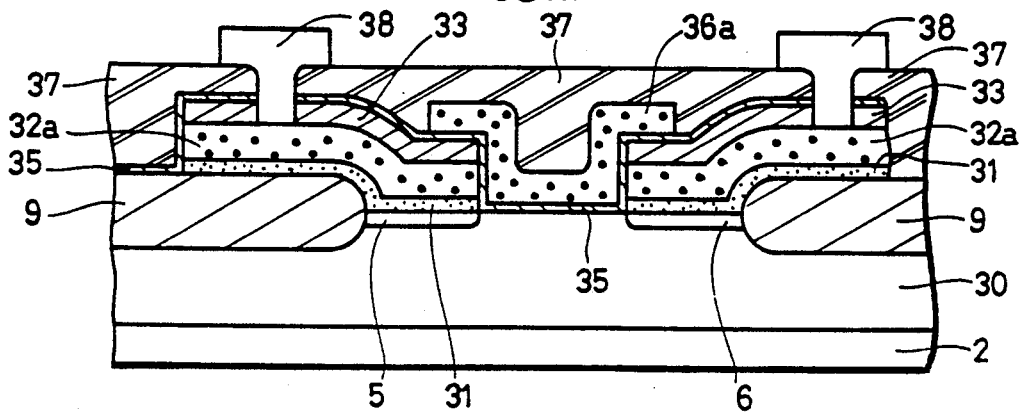

Finally, after an interlayer insulating film 37 is formed, contact holes are provided and an aluminum connection layer 38 is formed in each contact hole. Thus, the manufacturing process of the MOS FET is completed (as shown in FIG. 1F).

As described above, the gate electrode 36a of the MOS FET in this embodiment has the structure extending over the first polycrystalline silicon film 32a formed on the surfaces of the source and drain regions 5 and 6. Accordingly, even if a width of the channel region underlying the gate electrode 36a is very small, the extending areas of the gate electrode 36a over the first polycrystalline silicon film 36a can be made large. Thus, an effective sectional area for conduction of the gate electrode 36a can be made large. The above described structure makes it possible to lower the connection resistance of the gate electrode 36a.

The first polycrystalline silicon film 32a formed on the source and drain regions 5 and 6 serves to introduce impurity for formation of the source and the drain regions into the silicon substrate 2 and also serves as an internal connection for connecting the source and drain regions 5 and 6 with the aluminum connection layer 38. Since this internal connection is a laminated structure of the first polycrystalline silicon film 32a and the high melting point silicide film 31, the sheet resistance can be reduced. For example, in the case of a single layer structure of polycrystalline silicon, the sheet resistance is 100 to 700 $\Omega/\square$, while in the case of the laminated structure, the sheet resistance is decreased to 1 to 3$\Omega/\square$. The metal having high melting point or the silicide of that metal has higher melting point compared with the materials of interconnections such as Al. Therefore, the steps of high temperature reflow and thermal processing for making flat the surface of the layer laminated on the substrate can be carried out. The metal/silicide having high melting point can be easily removed by wet etching In addition, the source and drain regions 5 and 6 of the MOS FET of this embodiment are formed by thermal diffusion of the impurity from the first polycrystalline silicon layer 32a into the silicon substrate 2 through the high melting point metal silicide film 31. Consequently, the diffusion depth of the impurity can be controlled with higher precision and shallow junctions can be formed easily. The shallow junctions of the source and drain regions 5 and 6 make it possible to decrease a parasitic junction capacitance between the silicon substrate 2 and the source and drain regions 5 and 6.

Further, in the above described manufacturing method, the high melting point metal silicide film 31 deposited on the channel region of the silicon substrate 2 is used as a protection film against etching. More specifically, this high melting point metal silicide film 31 prevents damage of the surface of the silicon substrate 2 by plasma etching in the patterning process for gate formation in the first polycrystalline silicon film 32. After that, the high melting point metal silicide film 31 on the channel region is removed by a wet etching process not causing any damage to the surface of the substrate. Generally in view of the tendency to finely reduced structure of devices, etching for defining a channel region is preferably effected by a dry etching process having excellent precision of fine formation. However, dry etching unavoidably causes damage to the surface of the silicon substrate. On the other hand, wet etching has a limitation in precision of fine formation. Therefore, in this embodiment, dry etching is in principle used as etching for channel formation and the high melting point metal silicide film 31 is provided to prevent damage to the surface of the substrate. Wet etching is used for removal of the high melting point metal silicide film 31. Accordingly, in order to reduce isotropic effect in wet etching, the high melting point metal silicide film 31 is formed to have a thin thickness. Thus, the channel region on the surface of the silicon substrate 2 formed by the two etching processes has good crystallinity and the MOS FET thus obtained has excellent electric characteristics.

In the above described embodiment, the thermal diffusion process for formation of source and drain regions is applied in the step as shown in FIG. 1E. However, this process is not limited thereto. The thermal diffusion process may be executed at any suitable time insofar as it is after the end of the patterning process of the first polycrystalline silicon layer 31a.

Figure 2A:
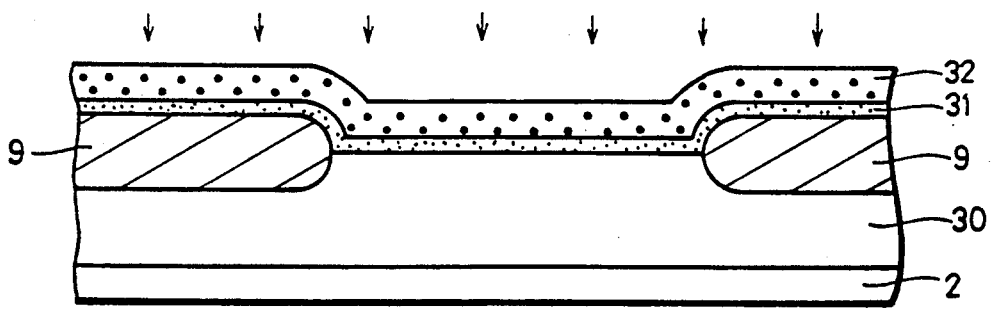
FIGS. 2A to 2E are sectional views showing successive steps of a method of manufacturing a MOS FET according to a second embodiment of the present invention.

Next, a preferred second embodiment of the present invention will be described with reference to FIGS. 2A to 2E. This second embodiment also relates to a structure of a MOS FET and a method of manufacturing thereof as in the above described first embodiment. Since the steps shown in FIGS. 2A and 2B are the same as the steps shown in FIGS. 1A and 1B of the first embodiment, description thereof is omitted.

Figure 2B:
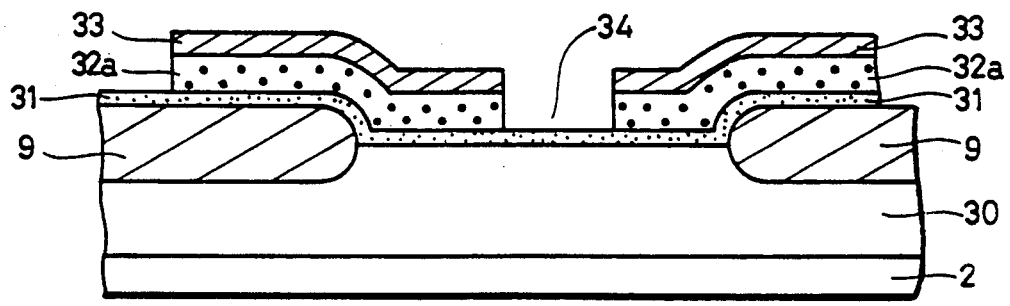

At an end of the step shown in FIG. 2B, the first polycrystalline silicon film 32a serving as an internal connection is formed and the high melting point metal silicide film 31 is exposed in the channel region 34.

Figure 2C:
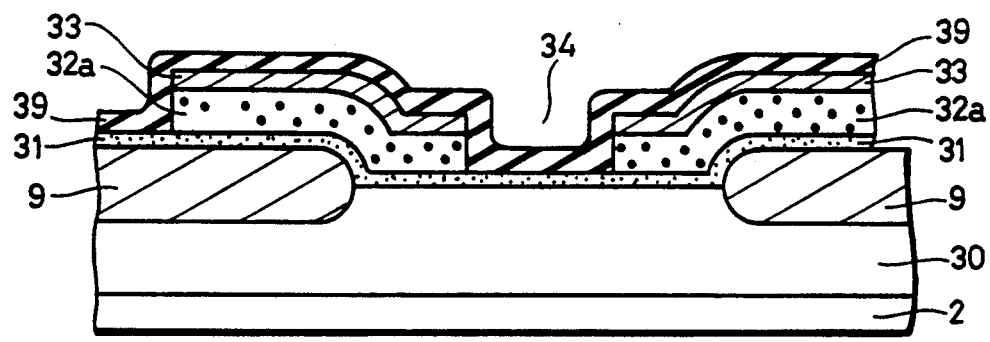
Figure 2D:
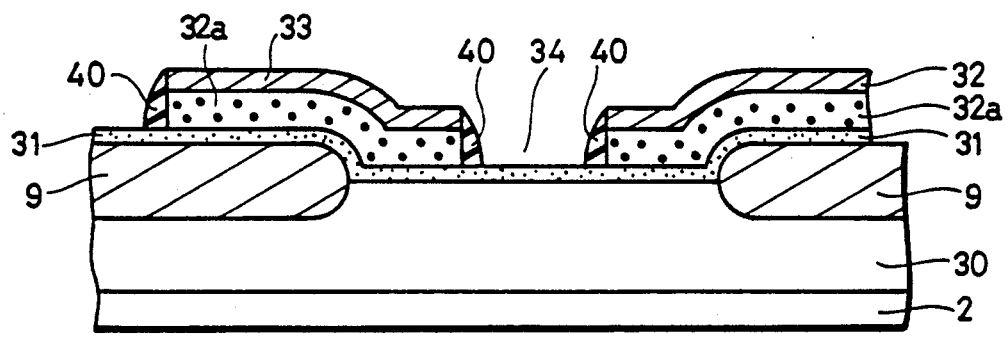

Then, a second silicon oxide film 39 is formed on the surface of the first polycrystalline silicon film pattern 32a and on the surface of the high melting point metal silicide film 31 in the channel region 34 by using a CVD method (as shown in FIG. 2C)

After that, the second silicon oxide film 39 is anisotropically etched by using reactive ion etching. As a result, the second silicon oxide film 39 remains only in regions facing side walls of the second polycrystalline silicon pattern 32a. The remaining second silicon oxide film regions are called side wall spacers 40 (see FIG. 2D). Meanwhile, since the side wall spacer 40 is formed by reactive ion etching, it is preferred that the etching is carried out with the film 31 of the silicide of the metal having high melting point left on the channel region. The reason for this is that the surface of the channel region of the silicon substrate 2 is damaged by the reactive ion etching for forming the side wall spacers 40 unless there is the film 31 of the silicide of the metal having high melting point.

Subsequently, the same steps as shown in FIGS. 1C to 1F of the first embodiment are executed, whereby the MOS FET is manufactured.

Figure 2E:
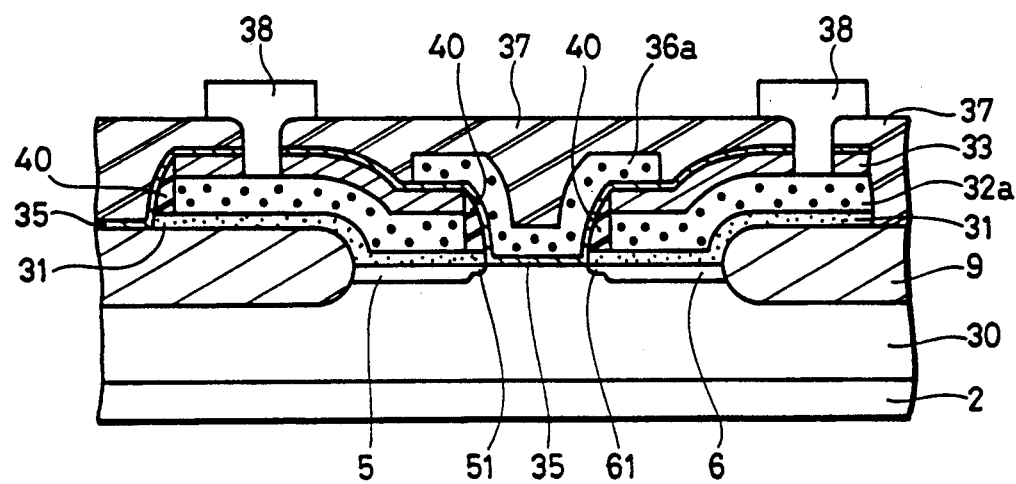
Figure 3:
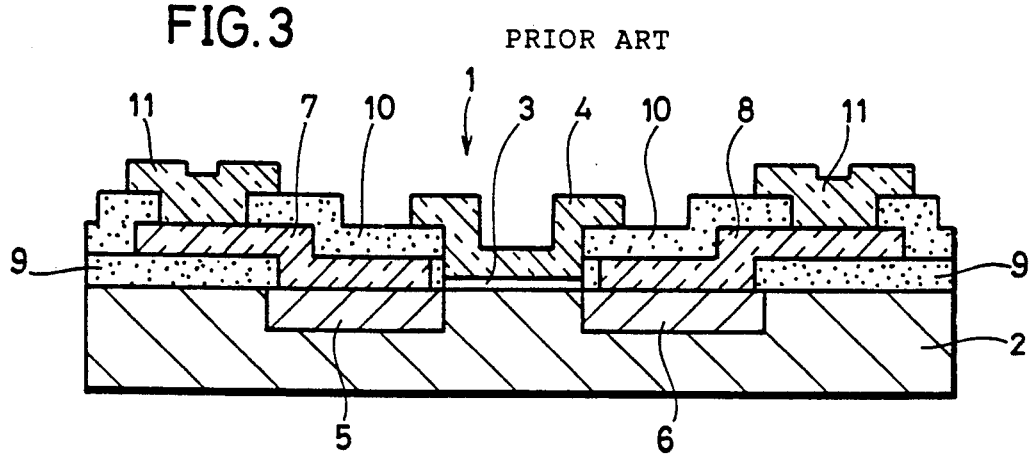
FIG. 3 is a sectional view showing a structure of a conventional MOS FET.
Figure 4A:
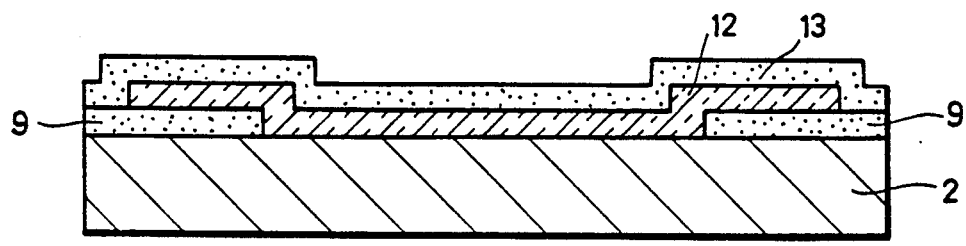
FIGS. 4A to 4C are sectional views showing main steps of a method of manufacturing the MOS FET shown in FIG. 3.
Figure 4B:
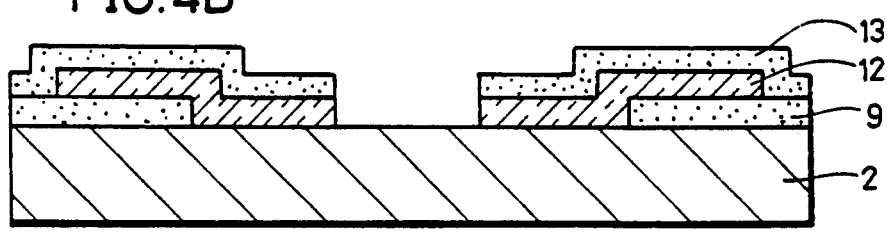
Figure 4C:
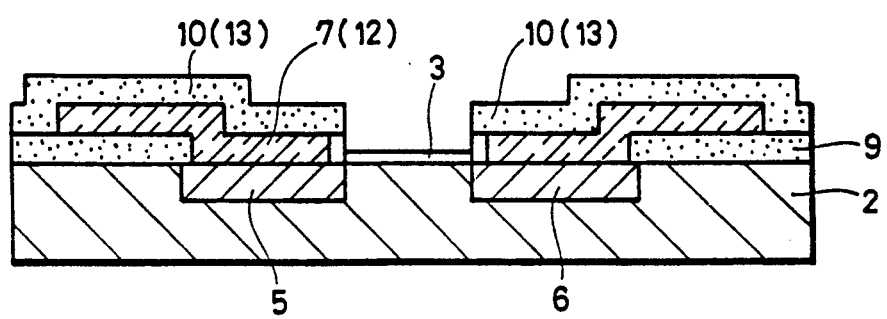

The side wall spacers 40 have the below described functions. Referring to FIG. 2E, firstly, the side wall spacers 40 ensure insulation between the gate electrode 36a and the electrodes 32a of the source and drain regions 5 and 6.

Secondly, the side wall spacers 40 constitute an offset structure of the electrodes (the first polycrystalline silicon film) 32a and the high melting point metal silicide film 31, in which side end positions of the first polycrystalline silicon film 32a as the electrodes and the high melting point metal silicide film 31, facing the channel region 34, deviate by a dimension corresponding to the thickness of each side wall spacer 40. If the thermal diffusion process is applied in such an offset structure of the first polycrystalline silicon film 32a containing the impurity and the high melting point metal silicide film 31, the impurity is diffused first from the first polycrystalline silicon film 32a to the high melting point metal silicide film 31 and then it is diffused into the silicon substrate 2 through the contact faces between the high melting point metal silicide film 31 and the surface of the silicon substrate 2. As a result, the impurity diffused from the part of the high melting point silicide film 31 located under each side wall spacer 40 is diffused in a period longer than that for diffusion of the impurity from the regions of the high melting point metal silicide film 31 in contact with the first polycrystalline silicon film 32a. In consequence, the regions 5 and 6 of higher impurity concentration having a larger depth of impurity diffusion and regions 51 and 61 of lower impurity concentration having a smaller depth of diffusion are formed in the same thermal diffusion process. Such a two-layer structure of low and high concentrations of the source and drain regions is generally called an LDD (lightly doped drain) structure. The LDD structure efficiently prevents a short channel effect and improves the electric characteristics of the MOS FET of the fine structure.

In the above described first and second embodiments, the metal film for forming the high melting point metal silicide film is a titanium film. However, the metal film is not limited thereto and it may be a film of a high melting point metal such as tungsten, molybdenum, cobalt, nickel, platinum, tantalum, zirconium or palladium. In addition, a high melting point metal film may be used in place of the high melting point metal silicide film and a composite film of those two films may be used.

The impurity injected in the polycrystalline silicon film as a conductive layer for electrode formed on the surfaces of the source and drain regions as shown in the first and second embodiments may be arsenic, phosphorus, boron or antimony for example.

Furthermore, although the present invention is applied to a MOS FET in the above described embodiments, the present invention may be applied to a complementary MOS device for example and the same effects can be obtained in such a case. In addition, the present invention is also applicable to a bipolar semiconductor device.

As described in the foregoing, according to the present invention, conductive layers for electrodes of a laminated structure including a high melting point metal silicide film and a polycrystalline silicon film are formed on the impurity regions of the silicon substrate and, thus, the fine structure of the device and the reduction of resistance in the connection for electrodes can be accomplished. In addition, according to a manufacturing method of the present invention, the high melting point metal silicide film is used to prevent the surface of the substrate from being damaged by etching of the first polycrystalline silicon film and it also serves to form impurity regions of shallow junction depth by thermal diffusion in the silicon substrate. Thus, the electric characteristics of the semiconductor device can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having, on a semiconductor substrate, conductive layers for electrode of a laminated structure including a conductive layer containing a refractory metal and a polycrystalline silicon layer, comprising the steps of:
   forming the conductive layer containing the refractory metal on said semiconductor substrate,
   forming a first polycrystalline silicon layer containing impurity on said conductive layer,
   forming a first insulating film on said first polycrystalline silicon layer,
   etching said first insulating film and said first polycrystalline silicon layer by a common etching step to form an opening attaining said conductive layer,
   etching said conductive layer having a surface exposed in said opening, thereby exposing a surface of said semiconductor substrate in said opening,
   forming a second insulating film on a bottom surface and inner side walls of said opening and on said first insulating film,
   forming a second polycrystalline silicon layer on said second insulating film,
   patterning said second polycrystalline silicon layer with a form, and
   diffusing the impurity contained in said first polycrystalline silicon layer into said semiconductor substrate by heat treatment.

2. A method of manufacturing a semiconductor device in accordance with claim 1, wherein
   said conductive layer containing the refractory metal is formed by the step of depositing a refractory metal film on said semiconductor substrate.

3. A method of manufacturing a semiconductor device in accordance with claim 1, wherein:
   said conductive layer containing the refractory metal is formed by the step of silicifying the refractory metal layer after the deposition thereof to form a refractory silicide layer.

4. A method of manufacturing a semiconductor device in accordance with claim 1, wherein
   said step of etching simultaneously said first insulating film and said polycrystalline silicon layer is executed by using dry etching and said step of etching subsequently said conductive layer exposed in said opening is executed by wet etching.

5. A method of manufacturing a semiconductor device having, on a semiconductor substrate, conductive layers for electrode of a laminated structure including a conductive layer containing a refractory metal and a polycrystalline silicon layer, comprising the steps of:
   forming the conductive layer containing the refractory metal on said semiconductor substrate,
   forming a first polycrystalline silicon layer containing impurity on said conductive layer,
   forming a first insulating film on said first polycrystalline silicon layer,
   etching said first insulating film and said first polycrystalline silicon layer by a common etching step to form an opening attaining said conductive layer,
   depositing a second insulating film on a bottom surface and inner side walls of said opening and on surfaces of said first insulating film,
   anisotropically etching said second insulating film to form side wall spacers of said second insulating film on inner side walls of said opening,
   etching said conductive layer having a surface exposed in said opening using said side walls spacers as masks, to expose a surface of said semiconductor substrate in said opening,
   forming a third insulating film on a bottom surface and inner side walls of said opening and on said first insulating film,
   forming a second polycrystalline silicon layer on said third insulating film,
   patterning said second polycrystalline silicon layer with a form, and
   diffusing the impurity contained in said first polycrystalline silicon layer into said semiconductor substrate by heat treatment.

6. A method of manufacturing a semiconductor device in accordance with claim 5, wherein
   said conductive layer containing the refractory metal is formed by the step of depositing a refractory metal layer on said semiconductor substrate.

7. A method of manufacturing a semiconductor device in accordance with claim 5, wherein
   said conductive layer containing the refractory metal is formed by the step of silicifying the refractory metal layer after the deposition thereof to form a refractory silicide layer.

8. A method of manufacturing a semiconductor device in accordance with claim 5, wherein
   said step of etching said first insulating film and said polycrystalline silicon layer is executed by dry etching and said step of etching subsequently said conductive layer exposed in said opening is executed by wet etching.

* * * * *

UNITED STATES PATENT AND TRADEMARK OFFICE
CERTIFICATE OF CORRECTION

PATENT NO. : 5,175,118
DATED : December 29, 1992
INVENTOR(S) : Masahiro YONEDA It is certified that error appears in the above-identified patent and that said Letters Patent is hereby corrected as shown below:

On the title page, at section [54], change the title from "MULTIPLE LAYER ELECTRODE STRUCTURE FOR SEMICONDUCTOR DEVICE AND METHOD OF MANUFACTURING THEREOF" to -- METHOD OF MANUFACTURING A SEMICONDUCTOR DEVICE HAVING A MULTIPLE LAYER ELECTRODE STRUCTURE --.

Signed and Sealed this

Fifteenth Day of February, 1994

Attest:

BRUCE LEHMAN

*Attesting Officer*  *Commissioner of Patents and Trademarks*